US010249614B2

(12) United States Patent
Chan et al.

(10) Patent No.: US 10,249,614 B2
(45) Date of Patent: Apr. 2, 2019

(54) SEMICONDUCTOR DEVICE

(71) Applicant: MACRONIX International Co., Ltd., Hsinchu (TW)

(72) Inventors: Wing-Chor Chan, Hsinchu (TW); Hsin-Liang Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 194 days.

(21) Appl. No.: 14/724,627

(22) Filed: May 28, 2015

(65) Prior Publication Data
US 2016/0351571 A1    Dec. 1, 2016

(51) Int. Cl.
*H01L 27/02*    (2006.01)
*H01L 29/06*    (2006.01)
*H01L 29/10*    (2006.01)
*H01L 29/78*    (2006.01)
*H01L 29/423*   (2006.01)

(52) U.S. Cl.
CPC ........ *H01L 27/027* (2013.01); *H01L 29/0692* (2013.01); *H01L 29/0696* (2013.01); *H01L 29/7816* (2013.01); *H01L 29/7835* (2013.01); *H01L 29/1095* (2013.01); *H01L 29/42368* (2013.01)

(58) Field of Classification Search
None
See application file for complete search history.

(56) References Cited

U.S. PATENT DOCUMENTS

| 4,672,407 | A | * | 6/1987 | Nakagawa | .......... H01L 29/0619 257/142 |
| 5,777,371 | A | * | 7/1998 | Kawaguchi | ......... H01L 29/0696 257/339 |
| 6,614,077 | B2 | | 9/2003 | Nakamura et al. | |
| 6,914,298 | B1 | | 7/2005 | Hamazawa | |
| 7,554,160 | B2 | | 6/2009 | Nakamura | |
| 8,723,258 | B2 | | 5/2014 | Nakaya et al. | |
| 2001/0048133 | A1 | | 12/2001 | Croce et al. | |
| 2011/0180870 | A1 | * | 7/2011 | Pendharkar | ......... H01L 27/0262 257/337 |
| 2014/0217464 | A1 | * | 8/2014 | Higuchi | ............ H01L 29/66348 257/139 |
| 2015/0249126 | A1 | * | 9/2015 | Kataoka | .............. H01L 29/0653 257/343 |

* cited by examiner

*Primary Examiner* — Samuel A Gebremariam
*Assistant Examiner* — Jonas T Beardsley
(74) *Attorney, Agent, or Firm* — J.C. Patents

(57) ABSTRACT

Provided is a semiconductor device including a gate structure, a first doped region of a first conductivity type, a plurality of second doped regions of a second conductivity type, a third doped region of the first conductivity type, and a plurality of fourth doped regions of the second conductivity type. The gate structure is located on a substrate. The first doped region is located in the substrate on a first side of the gate structure. The second doped regions are located in the first doped region. The second doped regions are separated from each other. The third doped region is located in the substrate on a second side of the gate structure. The fourth doped regions are located in the third doped region. The fourth doped regions are separated from each other. The second doped regions and the fourth doped regions are disposed alternately.

15 Claims, 8 Drawing Sheets

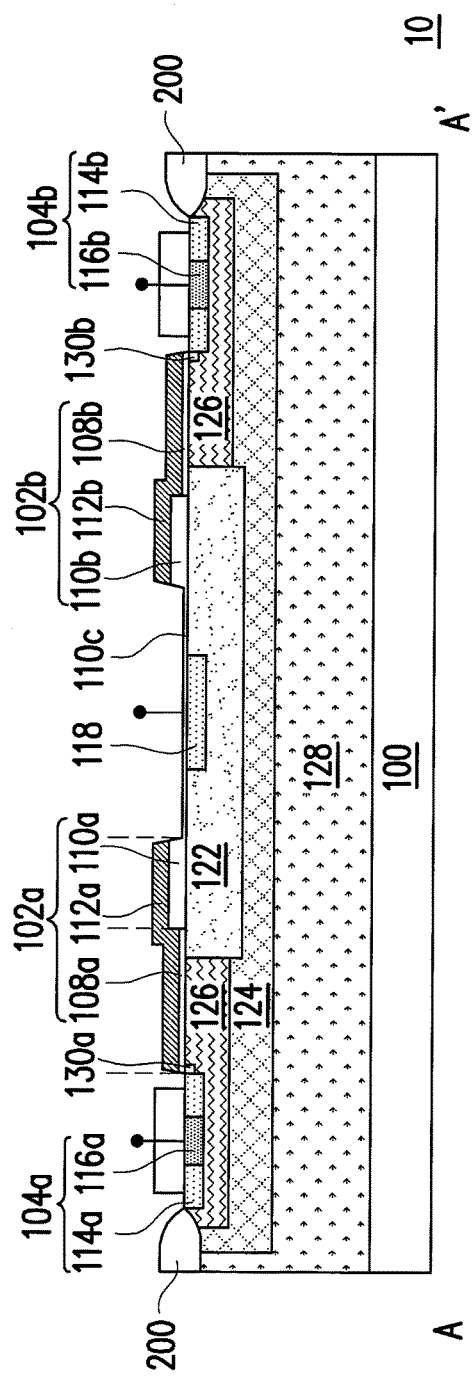
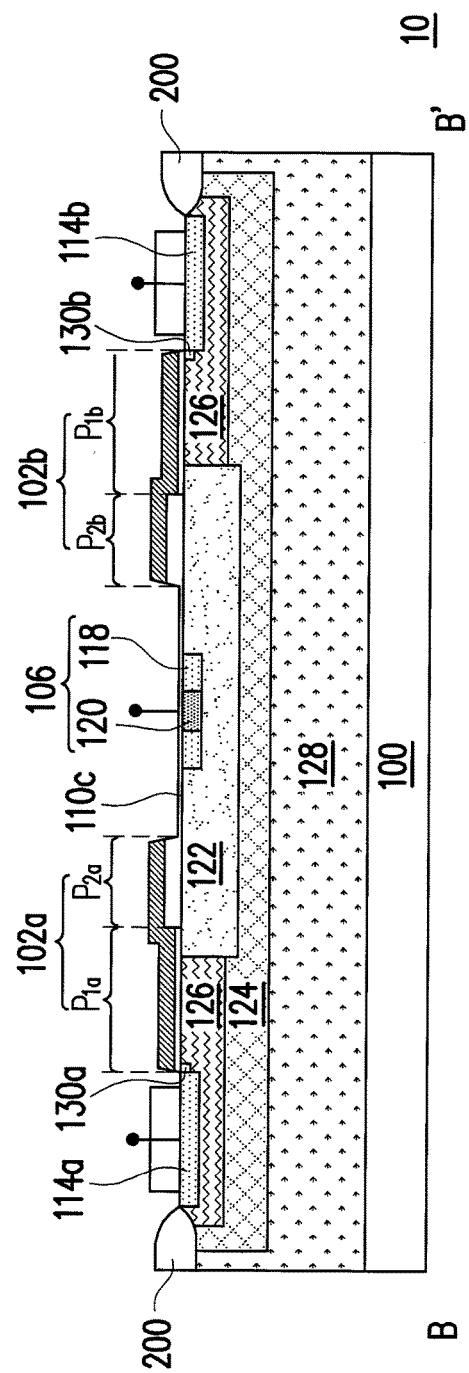
FIG. 2A
FIG. 2B

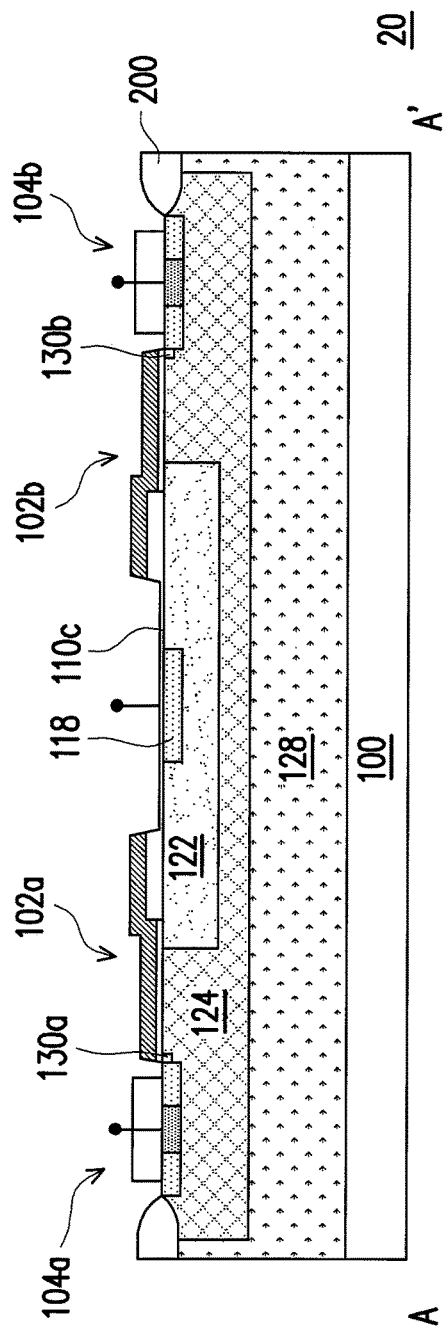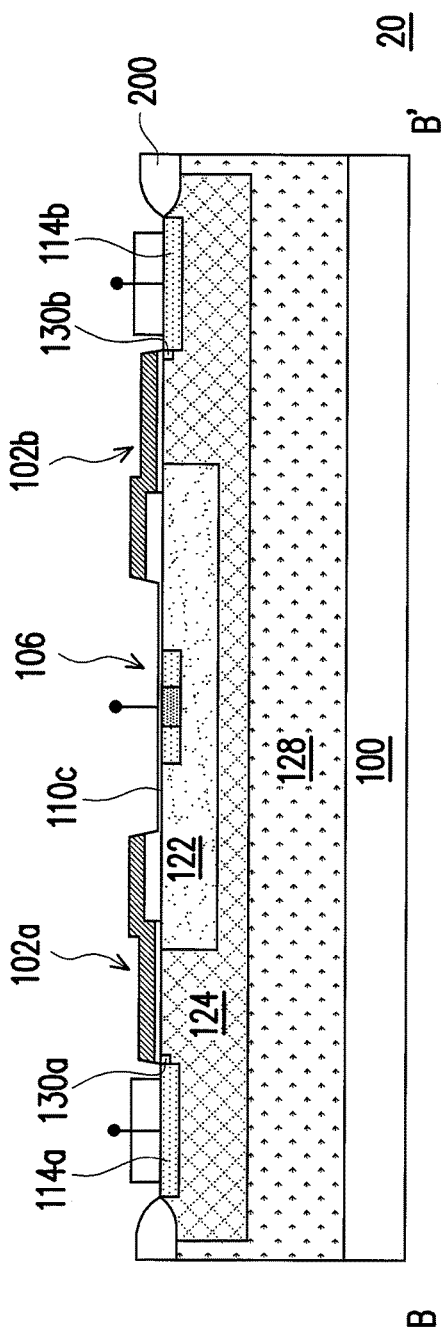
FIG. 3A
FIG. 3B

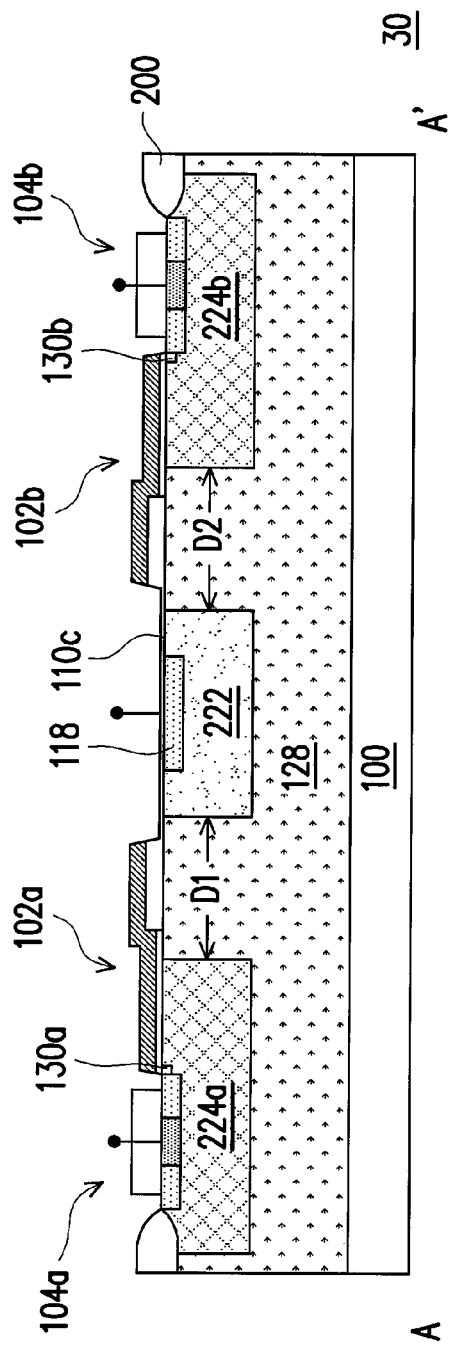
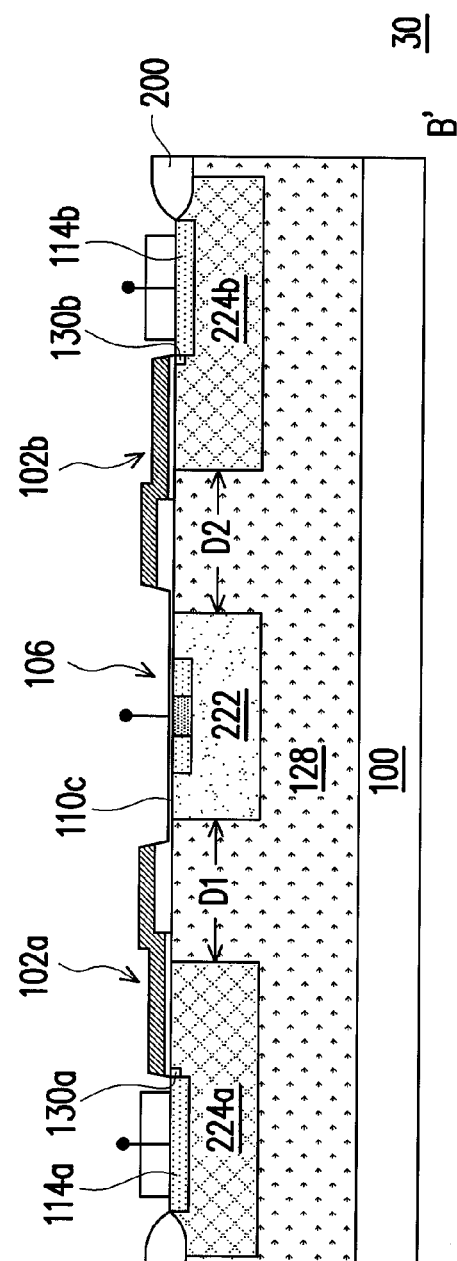
FIG. 4A
FIG. 4B

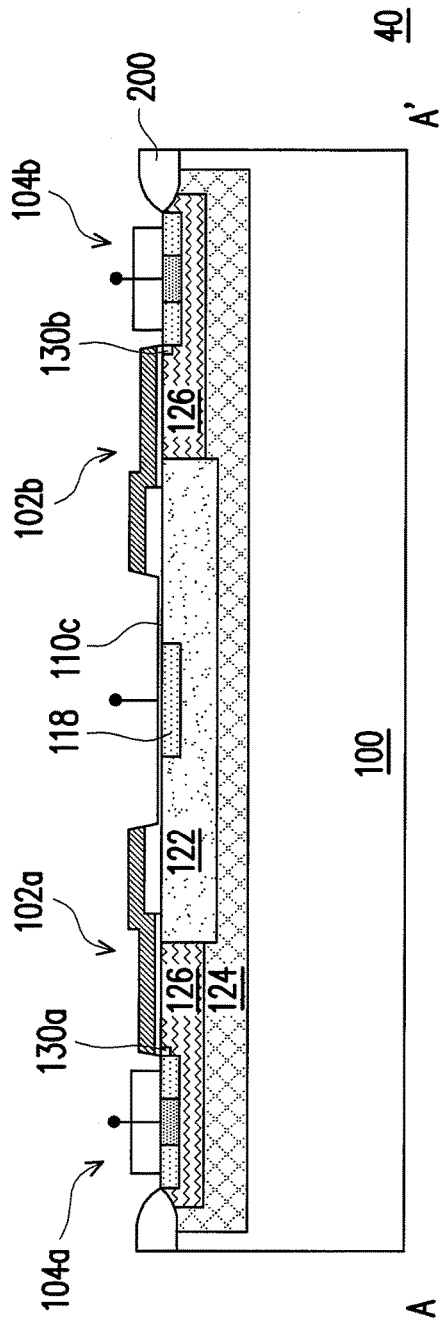
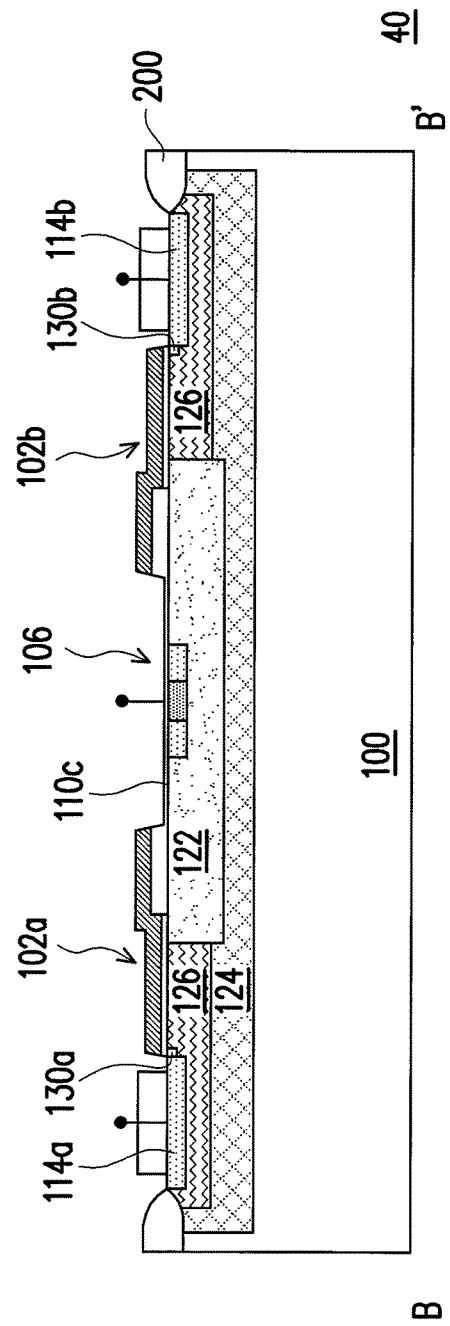
FIG. 5A
FIG. 5B

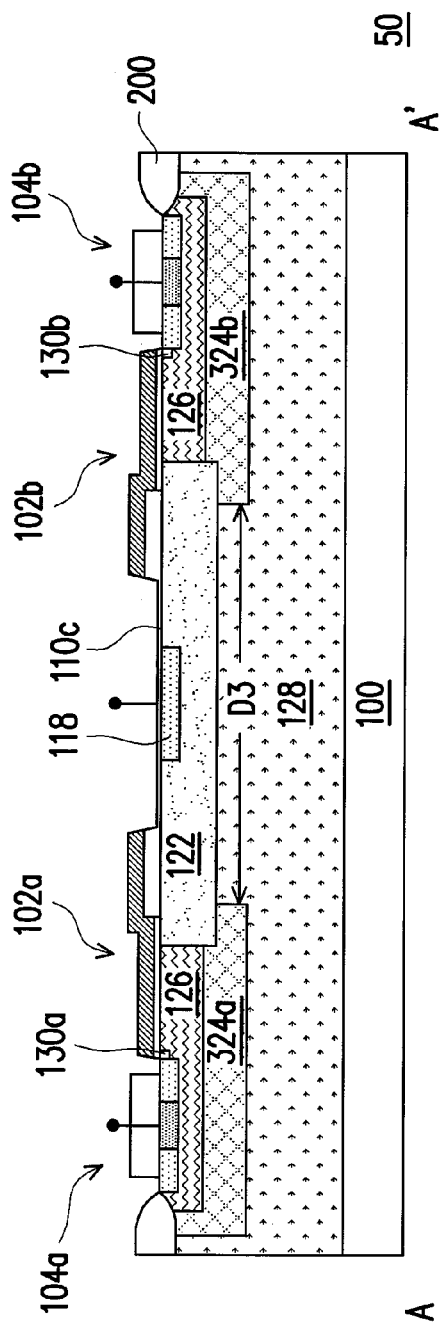
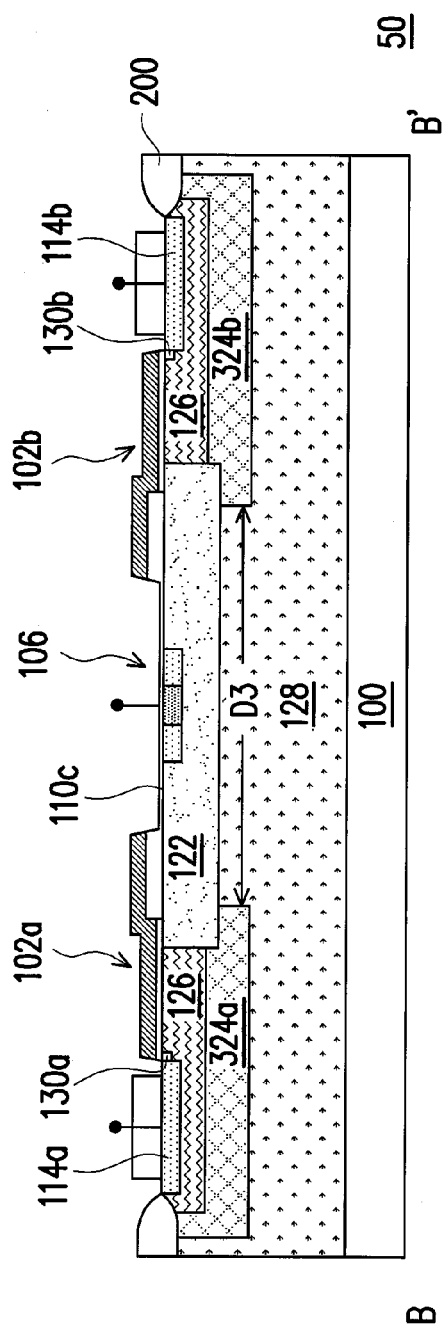
FIG. 6A
FIG. 6B

SEMICONDUCTOR DEVICE

BACKGROUND OF THE INVENTION

[Field of the Invention]

The invention relates to a semiconductor device and more particularly relates to a semiconductor device having an electrostatic discharge (ESD) protection capability.

[Description of Related Art]

Electrostatic discharge refers to a phenomenon that charges accumulated in a non-conductor or a non-grounded conductor, and then rapidly discharged through a discharge path in a short time. Electrostatic discharge would cause damage to the circuits in an integrated circuit. For example, a human body, a machine for packaging the integrated circuit, and an instrument for testing the integrated circuit are all common charged bodies. When such a charged body comes in contact with a chip, the charges may be discharged to the chip. An instantaneous power of the electrostatic discharge may damage the integrated circuit in the chip or cause failure.

Considering compatibility with the current CMOS manufacturing process, extended drain MOSFETs (EDMOSFET), lateral double-diffused MOSFETs (LDMOSFET), and reduced surface field (RESURF) are extensively applied to power semiconductor devices. In the field of power semiconductor devices, a MOS having a low on-state resistance is often used as a switch. However, the current only flows through the MOS surface of low on-state resistance, which limits the ESD discharging path. Moreover, a MOS having a high breakdown voltage (BV) also has a higher trigger voltage, and as a result, the risk of damaging the MOS increases. In the field of power semiconductor devices, the aforementioned two aspects impose a great challenge on improvement of the performance of electrostatic discharge protection.

SUMMARY OF THE INVENTION

The invention provides a semiconductor device having an electrostatic discharge (ESD) protection capability for reducing on-state resistance and improving performance of electrostatic discharge protection.

The invention provides a semiconductor device, including: a gate structure located on a substrate; a first doped region of a first conductivity type located in the substrate on a first side of the gate structure; a plurality of second doped regions of a second conductivity type located in the first doped region, wherein the second doped regions are separated from each other; a third doped region of the first conductivity type located in the substrate on a second side of the gate structure; and a plurality of fourth doped regions of the second conductivity type located in the third doped region, wherein the fourth doped regions are separated from each other, and the second doped regions and the fourth doped regions are disposed alternately.

In an embodiment of the invention, the gate structure includes a first portion close to the first doped region and including a first gate dielectric layer located on the substrate; and a second portion close to the third doped region and including a second gate dielectric layer located on the substrate, wherein a conductive layer covers the first gate dielectric layer and the second gate dielectric layer, and a thickness of the second gate dielectric layer is larger than a thickness of the first gate dielectric layer.

In an embodiment of the invention, the semiconductor device further includes a first well region of the first conductivity type located in the substrate, wherein the third doped region and the fourth doped regions are located in the first well region.

In an embodiment of the invention, the semiconductor device further includes a second well region of the second conductivity type located in the substrate, wherein the first doped region and the second doped regions are located in the second well region, and the second well region and the first well region are not in contact with each other.

In an embodiment of the invention, the semiconductor device further includes a fifth doped region of the first conductivity type located in the substrate, wherein the third doped region and the fourth doped regions are located in the fifth doped region, and the fifth doped region further extends below the gate structure.

In an embodiment of the invention, the semiconductor device further includes a second well region of the second conductivity type located in the substrate, wherein the fifth doped region is located in the second well region.

In an embodiment of the invention, the semiconductor device further includes a field region of the second conductivity type located in the substrate, wherein the first doped region and the second doped regions are located in the field region, and the field region and the fifth doped region are in contact with each other.

In an embodiment of the invention, the semiconductor device further includes a second well region of the second conductivity type located in the substrate, wherein the field region is located in the second well region.

In an embodiment of the invention, the second well region further extends below the fifth doped region.

In an embodiment of the invention, the semiconductor device further includes a deep well region of the first conductivity type located in the substrate, wherein the second well region is located in the deep well region.

In an embodiment of the invention, the semiconductor device further includes a sixth doped region of the first conductivity type located in the substrate on a side of the first doped region, wherein the sixth doped region extends below the gate structure.

In an embodiment of the invention, if the first conductivity type is N-type, the second conductivity type is P-type; and if the first conductivity type is P-type, the second conductivity type is N-type.

The invention further provides a semiconductor device, including: two gate structures located on a substrate; a drain region located in the substrate between the two gate structures; and two source regions respectively located in the substrate on a first side of one of the two gate structures and in the substrate on a second side of the other one of the two gate structures. Each of the two gate structures includes: a first portion close to the corresponding one of the two source regions and including a first gate dielectric layer located on the substrate; and a second portion close to the drain region and including a second gate dielectric layer located on the substrate, wherein a conductive layer covers the first gate dielectric layer and the second gate dielectric layer, and a thickness of the second gate dielectric layer is larger than a thickness of the first gate dielectric layer.

In an embodiment of the invention, each of the two source regions includes: a first doped region of a first conductivity type located in the substrate; and a plurality of second doped regions of a second conductivity type located in the first doped region, wherein the second doped regions are separated from each other. The drain region includes: a third doped region of the first conductivity type located in the substrate; and a plurality of fourth doped regions of the second conductivity type located in the third doped region, wherein the fourth doped regions are separated from each other, and the second doped regions and the fourth doped regions are disposed alternately.

The invention further provides a semiconductor device, including: a plurality of drain regions located in a substrate; a plurality of source regions located in the substrate, wherein the drain regions and the source regions are disposed at an interval in a checkerboard pattern; and a gate structure located on the substrate between the drain regions and the source regions to surround the drain regions and the source regions. The gate structure includes: a plurality of first portions, each of the first portions close to the corresponding one of the source regions and including a first gate dielectric layer located on the substrate; and a plurality of second portions, each of the second portions close to the corresponding one of the drain regions and including a second gate dielectric layer located on the substrate, wherein a conductive layer covers the first gate dielectric layer and the second gate dielectric layer, and a thickness of the second gate dielectric layer is larger than a thickness of the first gate dielectric layer.

In an embodiment of the invention, each of the source regions includes: a first doped region of a first conductivity type located in the substrate; and a second doped region of a second conductivity type located in the first doped region, wherein the first doped region surrounds the second doped region. Each of the drain regions includes: a third doped region of the first conductivity type located in the substrate; and a fourth doped region of the second conductivity type located in the third doped region, wherein the third doped region surrounds the fourth doped region.

In an embodiment of the invention, the gate structure is a mesh structure.

Based on the above, the invention reduces the on-state resistance of the device by using the thinner second gate dielectric layer. Moreover, because the second doped regions and the fourth doped regions are disposed alternately, the second doped regions, the first doped region, the substrate, the third doped region, and the fourth doped regions may be connected in parallel, so as to form the BJT structure (i.e. the P/N/P and N/P/N structure). As a result, the secondary breakdown current of the semiconductor device of the embodiment is improved. Therefore, the invention not only reduces the on-state resistance of the power semiconductor device but also improves the performance of electrostatic discharge protection of the semiconductor device of the embodiment.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 2A and FIG. 2B are schematic cross-sectional views of a semiconductor device, taken along the line A-A' and the line B-B', according to the first embodiment of the invention.

FIG. 3A and FIG. 3B are schematic cross-sectional views of a semiconductor device, taken along the line A-A' and the line B-B', according to the second embodiment of the invention.

FIG. 4A and FIG. 4B are schematic cross-sectional views of a semiconductor device, taken along the line A-A' and the line B-B', according to the third embodiment of the invention.

FIG. 5A and FIG. 5B are schematic cross-sectional views of a semiconductor device, taken along the line A-A' and the line B-B', according to the fourth embodiment of the invention.

FIG. 6A and FIG. 6B are schematic cross-sectional views of a semiconductor device, taken along the line A-A' and the line B-B', according to the fifth embodiment of the invention.

DESCRIPTION OF THE EMBODIMENTS

Figure 1:
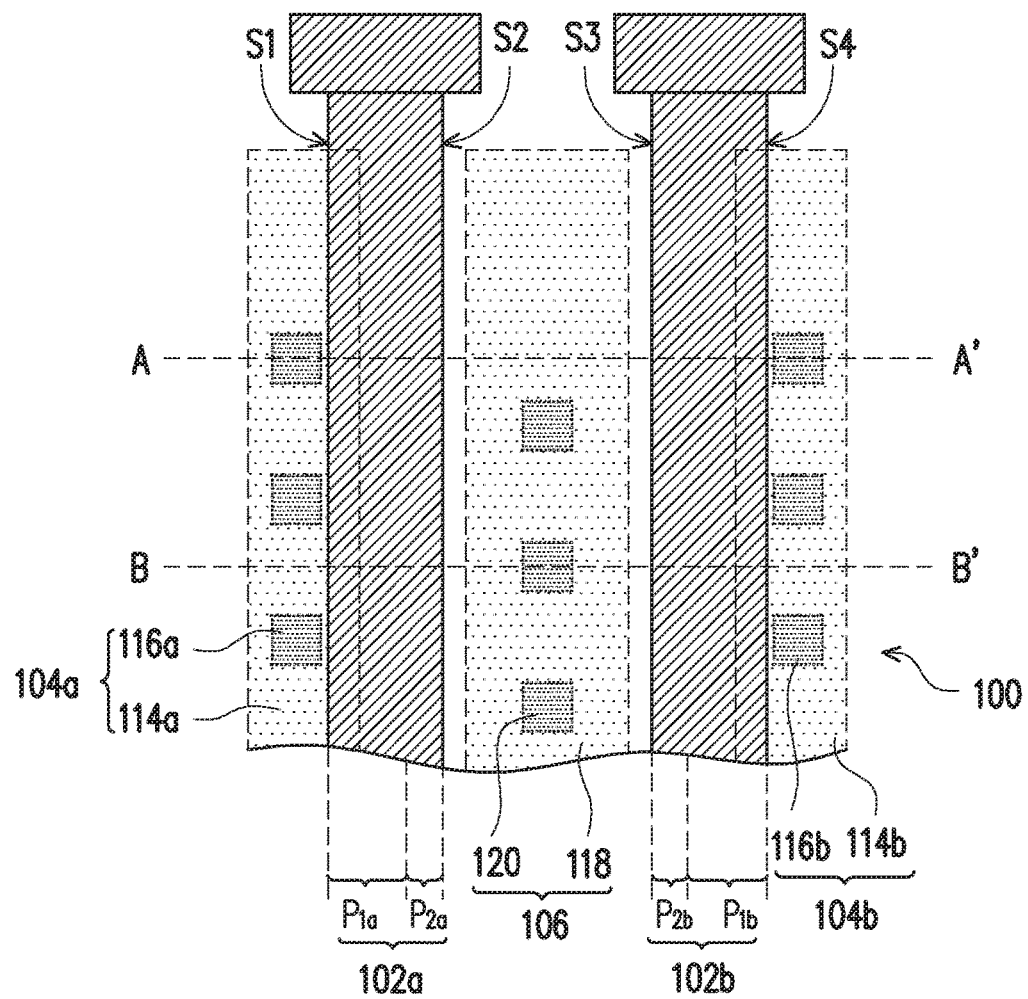
FIG. 1 is a schematic top view of a semiconductor device according to an embodiment of the invention.

In the following embodiments, if a first conductivity type is N-type, a second conductivity type is P-type; and if the first conductivity type is P-type, the second conductivity type is N-type. A P-type dopant is boron, for example; and an N-type dopant is phosphorous or arsenic, for example. In this embodiment, the first conductivity type is N-type and the second conductivity type is P-type, for example. However, it should be noted that the invention is not limited thereto. Hereinafter, the same or similar reference numerals represent the same or similar elements.

FIG. 1 is a schematic top view of a semiconductor device according to an embodiment of the invention. FIG. 2A and FIG. 2B are schematic cross-sectional views of the semiconductor device, taken along the line A-A' and the line B-B', according to the first embodiment of the invention.

First, with reference to FIG. 1, according to this top view, the invention provides a semiconductor device 1, which includes: a substrate 100, two gate structures 102a and 102b, two source regions 104a and 104b, and a drain region 106. The two gate structures 102a and 102b are located on the substrate 100. The drain region 106 is located in the substrate 100 between the two gate structures 102a and 102b. The source region 104a is located in the substrate 100 on a first side Si of the gate structure 102a; and the source region 104b is located in the substrate 100 on a second side S4 of the gate structure 102b. The substrate 100 is a semiconductor substrate of the first conductivity type, e.g. a P-type substrate, for example. A material of the semiconductor substrate is at least one selected from a group consisting of Si, Ge, SiGe, GaP, GaAs, SiC, SiGeC, InAs, and InP, for example. The substrate 100 may also be a non-EPI layer, an EPI layer, a SOI substrate, or a combination of the foregoing.

A semiconductor device 10 of the first embodiment of the invention is described in detail below as an example. With reference to FIG. 1, FIG. 2A, and FIG. 2B, the gate structure 102a includes: a first portion $P_{1a}$ and a second portion $P_{2a}$. The first portion $P_{1a}$ is close to the source region 104a and includes a first gate dielectric layer 108a on the substrate 100. The second portion $P_{2a}$ is close to the drain region 106 and includes a second gate dielectric layer 110a on the substrate 100. A conductive layer 112a covers the first gate dielectric layer 108a and the second gate dielectric layer 110a. A thickness of the second gate dielectric layer 110a is larger than a thickness of the first gate dielectric layer 108a. In an embodiment, the thickness of the first gate dielectric layer 108a is in a range of 5 nm to 30 nm. The thickness of the second gate dielectric layer 110a is in a range of 10 nm to 100 nm. A thickness of the conductive layer 112a is in a range of 80 nm to 500 nm, for example. A material of the first gate dielectric layer 108a and the second gate dielectric layer 110a includes a silicon oxide, a silicon nitride, or a high dielectric constant material having a dielectric constant larger than 4, for example. A forming method of the first gate dielectric layer 108a and the second gate dielectric layer 110a includes thermal oxidation or chemical vapor deposition (CVD), for example. A material of the conductive layer 112a includes doped polysilicon, undoped polysilicon, or a combination of the foregoing, for example. A forming method of the conductive layer 112a includes chemical vapor deposition, for example.

Likewise, the other gate structure 102b includes: a first portion $P_{1b}$ and a second portion $P_{2b}$. The first portion $P_{1b}$ is close to the source region 104b and includes a first gate dielectric layer 108b on the substrate 100. The second portion $P_{2b}$ is close to the drain region 106 and includes a second gate dielectric layer 110b on the substrate 100. A conductive layer 112b covers the first gate dielectric layer 108b and the second gate dielectric layer 110b. A thickness of the second gate dielectric layer 110b is larger than a thickness of the first gate dielectric layer 108b. The thicknesses, materials, and forming methods of the first gate dielectric layer 108b, the second gate dielectric layer 110b, and the conductive layer 112b are the same as those of the first gate dielectric layer 108a, the second gate dielectric layer 110a, and the conductive layer 112a as described above. Thus, details thereof are not repeated hereinafter. The semiconductor device 10 of the first embodiment further includes a dielectric layer 110c disposed on the substrate 100 of a third doped region 118 and covering a surface of the third doped region 118, so as to prevent the subsequent doping process, deposition process, and lithography and etching processes from causing damage to the surface of the substrate 100. However, the dielectric layer 110c on the third doped region 118 is removed in a subsequent process of forming a via for electrically connecting the third doped region 118 with the via (not shown).

It should be noted that, when compared with the thickness of the conventional field oxide (FOX) layer (i.e. 200 nm to 700 nm), the second gate dielectric layers 110a and 110b are thinner. Thus, formation of the second gate dielectric layers 110a and 110b does not consume too much material of the substrate 100, such that an interface between the second gate dielectric layers 110a and 110b and the substrate 100 is relatively flat. Accordingly, in comparison with the conventional technology, A traveling path when a current generated by the semiconductor device of this embodiment flowing through a fifth doped region 122 (as shown in FIG. 2A) under the second gate dielectric layers 110a and 110b is shorter, by which an on-state resistance is reduced. In an embodiment, in comparison with the conventional technology, the on-state resistance of the semiconductor device 10 of the first embodiment is reduced by 20% to 40%.

With reference to FIG. 1, FIG. 2A, and FIG. 2B, the source region 104a includes: a first doped region 114a of the first conductivity type and a plurality of second doped regions 116a of the second conductivity type. The first doped region 114a is located in the substrate 100. The second doped regions 116a are located in the first doped region 114a. The second doped regions 116a are separated from each other, and the first doped region 114a surrounds each of the second doped regions 116a. Likewise, the other source region 104b includes: a first doped region 114b of the first conductivity type and a plurality of second doped regions 116b of the second conductivity type. The first doped region 114b is located in the substrate 100. The second doped regions 116b are located in the first doped region 114b. The second doped regions 116b are separated from each other, and the first doped region 114b surrounds each of the second doped regions 116b. In an embodiment, a dopant implanted into the first doped regions 114a and 114b is phosphorus or arsenic, and a doping concentration thereof is in a range of $1\times10^{17}/cm^3$ to $8\times10^{20}/cm^3$, for example. A dopant implanted into the second doped regions 116a and 116b is boron, and a doping concentration thereof is in a range of $1\times10^{17}/cm^3$ to $8\times10^{20}/cm^3$, for example.

The drain region 106 includes: the third doped region 118 of the first conductivity type and a plurality of fourth doped regions 120 of the second conductivity type. The third doped region 118 is located in the substrate 100. The fourth doped regions 120 are located in the third doped region 118. The fourth doped regions 120 are separated from each other. The second doped regions 116a and 116b and the fourth doped regions 120 are disposed alternately. In other words, as shown in FIG. 1, in the direction of the line A-A' (or the direction of the line B-B'), the second doped regions 116a and 116b and the fourth doped regions 120 do not appear on the same cross section. Since the second doped regions 116a and 116b and the fourth doped regions 120 are arranged alternately, a distance of P/N/P/N/P junction formed by the second doped region 116a/the first doped region 114a/the substrate 100/the third doped region 118/the fourth doped region 120 is longer, by which a secondary breakdown current ($It_2$) of the semiconductor device of the embodiment is improved. The secondary breakdown current represents that the semiconductor device reaches the maximum current value that the p/n junction can sustain. Beyond this value, the semiconductor device would be permanently damaged and have a very large leakage current, and the original properties of the device cannot be recovered. Therefore, to improve the secondary breakdown current of the semiconductor device of this embodiment is to improve the performance of electrostatic discharge protection of the semiconductor device. In an embodiment, a dopant implanted into the third doped region 118 is phosphorus or arsenic, and a doping concentration thereof is in a range of $1\times10^{17}/cm^3$ to $8\times10^{20}/cm^3$, for example. A dopant implanted into the fourth doped regions 120 is boron, and a doping concentration thereof is in a range of $1\times10^{17}/cm^3$ to $8\times10^{20}/cm^3$, for example.

Moreover, with reference to FIG. 2A and FIG. 2B, the semiconductor device 10 of the first embodiment further includes: a fifth doped region 122 of the first conductivity type, a second well region 124 of the second conductivity type, a field region 126 of the second conductivity type, a deep well region 128 of the first conductivity type, and a sixth doped region 130 of the first conductivity type.

The fifth doped region 122 is located in the substrate 100. The third doped region 118 and the fourth doped regions 120 are located in the fifth doped region 122, and the fifth doped region 122 further extends below the gate structures 102a and 102b. In an embodiment, a dopant implanted into the fifth doped region 122 is phosphorus or arsenic, and a doping concentration thereof is in a range of $1\times10^{15}/cm^3$ to $5\times10^{18}/cm^3$, for example. Because the doping depth of the fifth doped region 122 is relatively shallow and the doping concentration is relatively higher, the on-state resistance of the device is reduced.

The field region 126 is located in the substrate 100. The first doped regions 114a and 114b and the second doped regions 116a and 116b are all located in the field region 126, and the field region 126 and the fifth doped region 122 are in contact with each other. The second well region 124 is located in the substrate 100. The fifth doped region 122 and the field region 126 are both located in the second well region 124. The second well region 124 extends from below the field region 126 to below the fifth doped region 122. The second well region 124 is located in the deep well region 128. In an embodiment, a dopant implanted into the second well region 124 is boron, and a doping concentration thereof is in a range of $2 \times 10^{14}/cm^3$ to $1 \times 10^{17}/cm^3$, for example. A dopant implanted into the field region 126 is boron, and a doping concentration thereof is in a range of $1 \times 10^{16}/cm^3$ to $5 \times 10^{18}/cm^3$, for example. In this embodiment, the properties of the channel of the device are adjusted by the concentration of the field region 126, by which a trigger voltage is reduced to improve the performance of electrostatic discharge protection of the device.

The deep well region 128 is located in the substrate 100. The sixth doped region 130a is located in the substrate 100 on a side of the first doped region 104a and extends below the gate structure 102a. Likewise, the sixth doped region 130b is located in the substrate 100 on a side of the first doped region 104b and extends below the gate structure 102b. In an embodiment, a dopant implanted into the deep well region 128 is phosphorus or arsenic, and a doping concentration thereof is in a range of $5 \times 10^{13}/cm^3$ to $8 \times 10^{16}/cm^3$, for example. A dopant implanted into the sixth doped regions 130a and 130b is phosphorus or arsenic, and a doping concentration thereof is in a range of $1 \times 10^{15}/cm^3$ to $5 \times 10^{17}/cm^3$, for example.

In addition, the semiconductor device 10 of the first embodiment further includes two isolation structures 200 disposed in the substrate 100 on two sides of the two source regions 104a and 104b, so as to electrically isolate other devices. A material of the isolation structures 200 includes a doped or undoped silicon oxide, a low stress silicon nitride, a silicon oxynitride, or a combination of the foregoing, and a forming method of the isolation structures 200 includes local thermal oxidation (LOCOS) or shallow trench isolation (STI), for example.

Based on the above, in the invention, the on-state resistance of the device is reduced by using the thinner second gate dielectric layer. Moreover, because the second doped regions and the fourth doped regions are disposed alternately, the second doped regions, the first doped region, the substrate, the third doped region, and the fourth doped regions may be connected in parallel, so as to form the BJT structure (i.e. the P/N/P and N/P/N structure). As a result, the secondary breakdown current of the semiconductor device of the embodiment is improved. Therefore, the invention not only reduces the on-state resistance of the power semiconductor device but also improves the performance of electrostatic discharge protection of the semiconductor device of the embodiment.

FIG. 3A and FIG. 3B are schematic cross-sectional views of a semiconductor device, taken along the line A-A' and the line B-B', according to the second embodiment of the invention.

With reference to FIG. 3A and FIG. 3B, a semiconductor device 20 of the second embodiment is similar to the semiconductor device 10 of the first embodiment of the invention, and a difference therebetween lies in that: the semiconductor device 20 of the second embodiment does not include the field region 126 located in the second well region 124.

FIG. 4A and FIG. 4B are schematic cross-sectional views of a semiconductor device, taken along the line A-A' and the line B-B', according to the third embodiment of the invention.

With reference to FIG. 4A and FIG. 4B, a semiconductor device 30 of the third embodiment is similar to the semiconductor device 20 of the second embodiment of the invention. A difference therebetween lies in that: the semiconductor device 30 of the third embodiment includes a first well region 222 of the first conductivity type in place of the fifth doped region 122 of the semiconductor device 20; and second well regions 224a and 224b of the second conductivity type in place of the second well region 124 of the semiconductor device 20. The first well region 222 is located in the deep well region 128. The third doped region 118 and the fourth doped regions 120 are located in the first well region 222. The second well regions 224a and 224b are both located in the deep well region 128. The first doped region 114a and the second doped region 116a are located in the second well region 224a; and the first doped region 114b and the second doped region 116b are located in the second well region 224b. The first well region 222 and the second well regions 224a and 224b are not in contact with each other. A distance D1 exists between the first well region 222 and the second well region 224a; and a distance D2 exists between the first well region 222 and the second well region 224b. In the third embodiment, a breakdown voltage of the semiconductor device 30 is adjusted by adjusting the distances D1 and D2. In addition, according to the third embodiment, the performance of electrostatic discharge protection of the semiconductor device 30 is controlled by adjusting the doping concentration and doping depth of the first well region 222. In an embodiment, a dopant implanted into the first well region 222 is phosphorus or arsenic, and the doping concentration thereof is in a range of $2 \times 10^{14}/cm^3$ to $5 \times 10^{17}/cm^3$ and the doping depth thereof is in a range of 1000 nm to 4000 nm, for example. A dopant implanted into the second well regions 224a and 224b is boron, and a doping concentration thereof is in a range of $2 \times 10^{14}/cm^3$ to $1 \times 10^{17}/cm^3$, for example.

FIG. 5A and FIG. 5B are schematic cross-sectional views of a semiconductor device, taken along the line A-A' and the line B-B', according to the fourth embodiment of the invention.

With reference to FIG. 5A and FIG. 5B, a semiconductor device 40 of the fourth embodiment is similar to the semiconductor device 10 of the first embodiment of the invention, and a difference therebetween lies in that: the semiconductor device 40 of the fourth embodiment does not include the deep well region 128 located in the substrate 100.

FIG. 6A and FIG. 6B are schematic cross-sectional views of a semiconductor device, taken along the line A-A' and the line B-B', according to the fifth embodiment of the invention.

With reference to FIG. 6A and FIG. 6B, a semiconductor device 50 of the fifth embodiment is similar to the semiconductor device 10 of the first embodiment of the invention. A difference therebetween lies in that: the semiconductor device 50 of the fifth embodiment includes second well regions 324a and 324b located in the deep well region 128, and the second well regions 324a and 324b are separated from each other. A distance D3 exists between the second well regions 324a and 324b. Because the second well regions 324a and 324b do not extend below the center of the fifth doped region 122, the doping concentration at the surface of the fifth doped region 122 of the semiconductor device 50 is maintained to reduce the on-state resistance of the semiconductor device 50.

Figure 7:
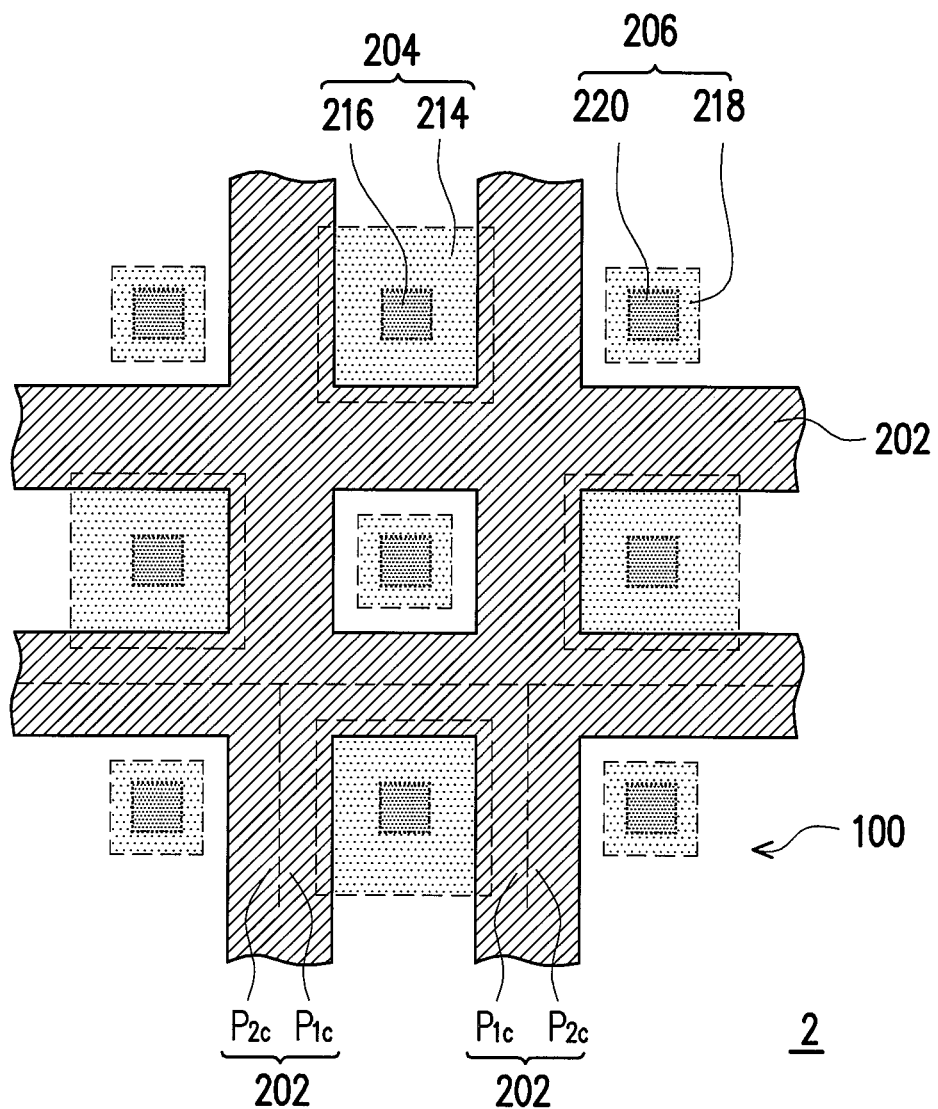
FIG. 7 is a schematic top view of a semiconductor device according to another embodiment of the invention.

FIG. 7 is a schematic top view of a semiconductor device according to another embodiment of the invention.

With reference to FIG. 7, the invention further provides a semiconductor device 2, which includes: a gate structure 202, a plurality of source regions 204, and a plurality of drain regions 206. The source regions 204 and the drain regions 206 are arranged at intervals in a checkerboard pattern. The gate structure 202 has a continuous mesh structure, for example, disposed on the substrate 100 between the source regions 204 and the drain regions 206 and surrounding the source regions 204 and the drain regions 206. Specifically, the gate structure 202 includes a first portion $P_{1c}$ and a second portion $P_{2c}$. The first portion $P_{1c}$ is close to the source region 204 and includes a first gate dielectric layer located on the substrate (not shown). The second portion $P_{2c}$ is close to the drain region 206 and includes a second gate dielectric layer located on the substrate (not shown). A conductive layer covers the first gate dielectric layer and the second gate dielectric layer. A thickness of the second gate dielectric layer is larger than a thickness of the first gate dielectric layer (not shown). The thicknesses, materials, and forming methods of the first gate dielectric layer, the second gate dielectric layer, and the conductive layer of the semiconductor device 2 are the same as those of the first gate dielectric layer 108a, the second gate dielectric layer 110a, and the conductive layer 112a as described above. Thus, details thereof are not repeated hereinafter.

Likewise, the source region 204 of the semiconductor device 2 also includes: a first doped region 214 of the first conductivity type and a second doped region 216 of the second conductivity type. The first doped region 214 is located in the substrate 100. The second doped region 216 is located in the first doped region 214. The first doped region 214 surrounds the second doped region 216. The drain region 206 includes: a third doped region 218 of the first conductivity type and a fourth doped region 220 of the second conductivity type. The third doped region 218 is located in the substrate 100. The fourth doped region 220 is located in the third doped region 218. The third doped region 218 surrounds the fourth doped region 220. The dopants and doping concentrations of the first doped region 214, the second doped region 216, the third doped region 218, and the fourth doped region 220 of the semiconductor device 2 are the same as those of the first doped region 114a, the second doped region 116a, the third doped region 118, and the fourth doped region 120 as described above. Thus, details thereof are not repeated hereinafter. Although FIG. 1 and FIG. 7 illustrate the situations where the semiconductor devices respectively have strip and square structures, the invention is not limited thereto. In other embodiments, the structure of the semiconductor device may be rectangular, hexagonal, octagonal, circular, or a combination of the foregoing, for example.

Figure 8A:
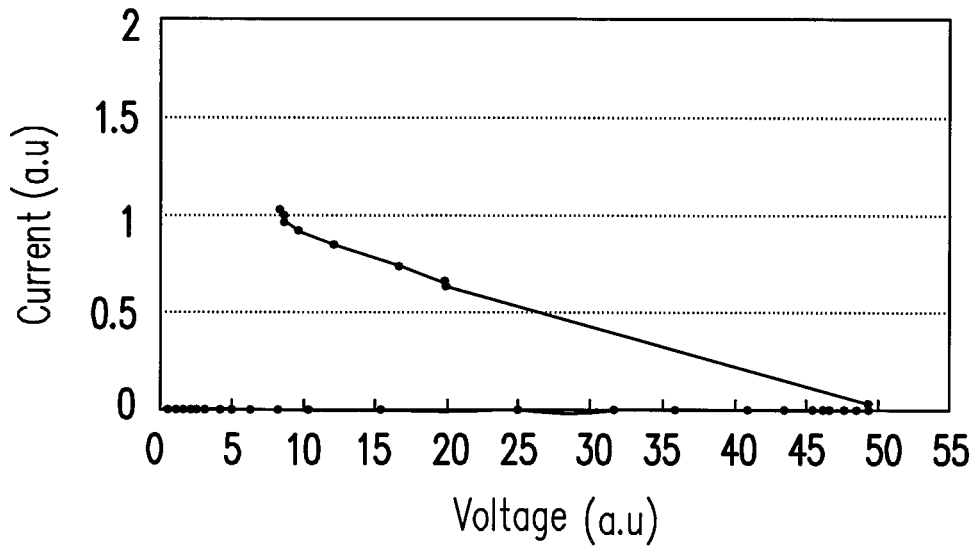
FIG. 8A is a voltage-current diagram showing the ESD test result of a conventional semiconductor device.
Figure 8B:
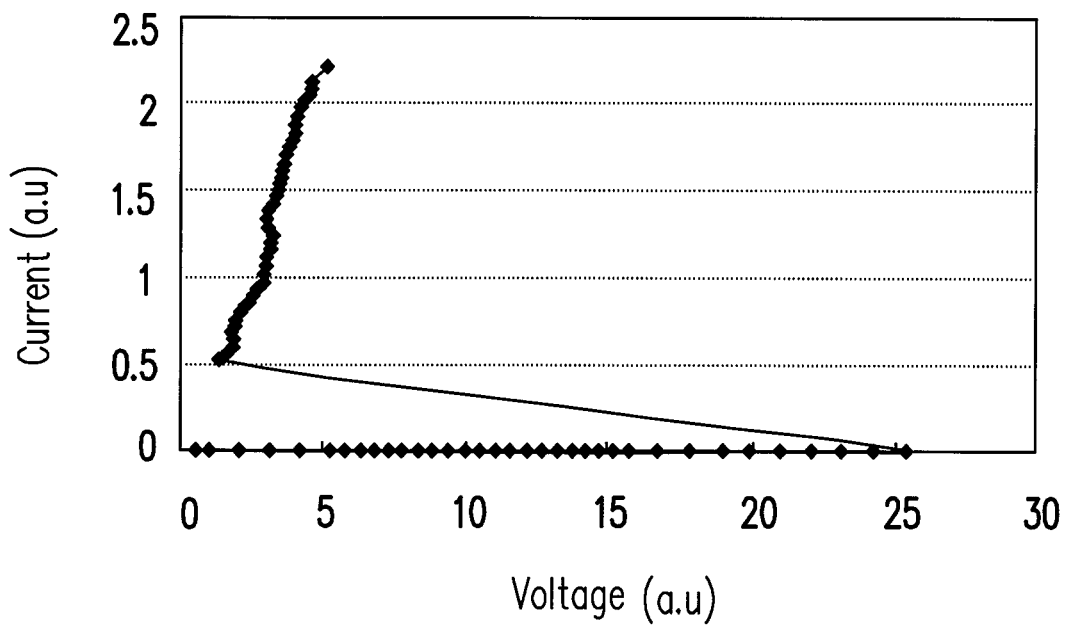
FIG. 8B is a voltage-current diagram showing the ESD test result of the semiconductor device of the first embodiment of the invention.

FIG. 8A is a voltage-current diagram showing the ESD test result of a conventional semiconductor device. FIG. 8B is a voltage-current diagram showing the ESD test result of the semiconductor device of the first embodiment of the invention.

This test was carried out using a transmission line pulse (TLP) generating system. With reference to FIG. 8A and FIG. 8B, according to the test result, when the conventional semiconductor device and the semiconductor device of the first embodiment had the same breakdown voltage (BV=32V), the trigger voltage of the conventional semiconductor device was about 50V, and the trigger voltage of the semiconductor device of the first embodiment was about 25V. The trigger voltage (25V) of the semiconductor device of the first embodiment was far smaller than the breakdown voltage (32V) of the semiconductor device. In addition, the TLP current (i.e. secondary breakdown current) of the semiconductor device of the first embodiment was about 2.2 times the TLP current of the conventional semiconductor device. Accordingly, the semiconductor device of this embodiment exhibits favorable performance in electrostatic discharge protection.

In conclusion of the above, the invention reduces the on-state resistance of the device by using the thinner second gate dielectric layer. Moreover, because the second doped regions and the fourth doped regions are disposed alternately, the second doped regions, the first doped region, the substrate, the third doped region, and the fourth doped regions may be connected in parallel, so as to form the BJT structure (i.e. the P/N/P and N/P/N structure). As a result, the secondary breakdown current of the semiconductor device of the embodiment is improved. Further, the invention uses the doping concentrations and doping depths of different doped regions and the distances between the doped regions to adjust the breakdown voltage of the semiconductor device. Thus, the invention not only reduces the on-state resistance of the power semiconductor device and adjusts the breakdown voltage of the semiconductor device but also improves the performance of the electrostatic discharge protection of the semiconductor device of the embodiment.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor device, comprising:
a gate structure located on a substrate;
a first doped region of a first conductivity type located in the substrate on a first side of the gate structure, wherein the first doped region partially overlaps with the gate structure in top view at the first side of the gate structure but not at a second side of the gate structure;
a plurality of second doped regions of a second conductivity type located in the first doped region, wherein the second doped regions are separated from each other and are aligned with each other in a first direction;
a third doped region of the first conductivity type located in the substrate on the second side of the gate structure; and
a plurality of fourth doped regions of the second conductivity type each entirely located in the third doped region in top view, wherein the third doped region has therein only a single column of the plurality of fourth doped regions, the fourth doped regions are separated from each other and are aligned with each other in the first direction, the second doped regions are not aligned with the fourth doped regions in a second direction perpendicular to the first direction, the first doped region and the second doped regions are a source region, and the third doped region and the fourth doped regions are a drain region.

2. The semiconductor device according to claim 1, wherein the gate structure comprises:
   a first portion close to the first doped region and comprising a first gate dielectric layer located on the substrate; and
   a second portion close to the third doped region and comprising a second gate dielectric layer located on the substrate, wherein a conductive layer covers the first gate dielectric layer and the second gate dielectric layer, and a thickness of the second gate dielectric layer is larger than a thickness of the first gate dielectric layer.

3. The semiconductor device according to claim 1, further comprising a first well region of the first conductivity type located in the substrate, wherein the third doped region and the fourth doped regions are located in the first well region.

4. The semiconductor device according to claim 3, further comprising a second well region of the second conductivity type located in the substrate, wherein the first doped region and the second doped regions are located in the second well region, and the second well region and the first well region are not in contact with each other.

5. The semiconductor device according to claim 4, further comprising a deep well region of the first conductivity type located in the substrate, wherein the second well region is located in the deep well region.

6. The semiconductor device according to claim 1, further comprising a fifth doped region of the first conductivity type located in the substrate, wherein the third doped region and the fourth doped regions are located in the fifth doped region, and the fifth doped region further extends below the gate structure.

7. The semiconductor device according to claim 6, further comprising a second well region of the second conductivity type located in the substrate, wherein the fifth doped region is located in the second well region.

8. The semiconductor device according to claim 7, further comprising a deep well region of the first conductivity type located in the substrate, wherein the second well region is located in the deep well region.

9. The semiconductor device according to claim 6, further comprising a field region of the second conductivity type located in the substrate, wherein the first doped region and the second doped regions are located in the field region, and the field region and the fifth doped region are in contact with each other.

10. The semiconductor device according to claim 9, further comprising a second well region of the second conductivity type located in the substrate, wherein the field region is located in the second well region.

11. The semiconductor device according to claim 10, wherein the second well region further extends below the fifth doped region.

12. The semiconductor device according to claim 10, further comprising a deep well region of the first conductivity type located in the substrate, wherein the second well region is located in the deep well region.

13. The semiconductor device according to claim 1, further comprising a sixth doped region of the first conductivity type located in the substrate on a side of the first doped region, wherein the sixth doped region extends below the gate structure.

14. The semiconductor device according to claim 1, wherein if the first conductivity type is N-type, the second conductivity type is P-type; and if the first conductivity type is P-type, the second conductivity type is N-type.

15. A semiconductor device, comprising:
   a first gate structure and a second gate structure located on a substrate;
   a drain region located in the substrate between the first gate structure and the second gate structure; and
   a first source region located in the substrate on a first side of the first gate structure, and a second source region located in the substrate on a second side of the second gate structure,
   wherein the first gate structure comprises:
   a first portion of the first gate structure close to the first source region and comprising a first gate dielectric layer located on the substrate; and
   a second portion of the first gate structure close to the drain region and comprising a second gate dielectric layer located on the substrate,
   wherein the second gate structure comprises:
   a third portion of the second gate structure close to the second source region and comprising the first gate dielectric layer located on the substrate; and
   a fourth portion of the second gate structure close to the drain region and comprising the second gate dielectric layer located on the substrate,
   wherein a conductive layer covers the first gate dielectric layer and the second gate dielectric layer, and a thickness of the second gate dielectric layer is larger than a thickness of the first gate dielectric layer,
   wherein each of the first and second source regions comprises:
   a first doped region of a first conductivity type located in the substrate; and
   a plurality of second doped regions of a second conductivity type located in the first doped region, wherein the second doped regions in the first source region are separated from each other and are aligned with each other in a first direction, and the second doped regions in the second source region are separated from each other and are aligned with each other in the first direction; and wherein the drain region comprises:
   a third doped region of the first conductivity type located in the substrate; and
   a plurality of fourth doped regions of the second conductivity type each entirely located in the third doped region, wherein the third doped region has therein only a single column of the plurality of fourth doped regions, the fourth doped regions are separated from each other and are aligned with each other in the first direction, and the second doped regions are not aligned with the fourth doped regions in a second direction perpendicular to the first direction,
   wherein the first doped region of the first source region partially overlaps in top view with the first gate structure at the first side of the first gate structure but not at a second side of the first gate structure, and the first doped region of the second source region partially overlaps in top view with the second gate structure at the second side of the second gate structure but not at a first side of the second gate structure.

* * * * *